United States Patent [19]
Higashiyama et al.

[11] Patent Number: 6,091,292
[45] Date of Patent: Jul. 18, 2000

[54] HIGH EFFICIENCY POWER AMPLIFYING APPARATUS

[75] Inventors: Katsuhiko Higashiyama, Neyagawa; Tsuyoshi Sato, Yawata, both of Japan

[73] Assignee: Matsushita Electric Industrial Co., Ltd., Osaka-fu, Japan

[21] Appl. No.: 09/282,355

[22] Filed: Mar. 31, 1999

[30] Foreign Application Priority Data

Mar. 31, 1998 [JP] Japan .................................. 10-085814

[51] Int. Cl.[7] ........................................................ H03F 3/38
[52] U.S. Cl. .......................................... 330/10; 330/207 A
[58] Field of Search ................................. 330/10, 207 A, 330/251, 136

[56] References Cited

U.S. PATENT DOCUMENTS

| | | | |
|---|---|---|---|
| 4,390,849 | 6/1983 | Miskin | 330/251 |
| 5,847,602 | 12/1998 | Su | 330/10 |
| 5,973,556 | 10/1999 | Su | 330/10 |

FOREIGN PATENT DOCUMENTS

| | | | |
|---|---|---|---|
| 508900 | 3/1976 | U.S.S.R. | 330/10 |

*Primary Examiner*—Robert Pascal
*Assistant Examiner*—Henry Choe
*Attorney, Agent, or Firm*—Greenblum & Bernstein, P.L.C.

[57] ABSTRACT

A parallel, synchronously driven linear power amplifier (6) and class D power amplifier (2) form an equivalent active filter, minimizing the scale of the passive filter (3), and effectively suppressing high frequency noise. First to third muting circuits (17–19) are used when the power supply is turned on and off to interrupt signal supply from the signal input terminal, and control operation of the class D power amplifier (2) and linear voltage amplifier (15), thereby preventing extraneous irritating noises such as popping sounds from a loudspeaker.

24 Claims, 13 Drawing Sheets

HIGH EFFICIENCY POWER AMPLIFYING APPARATUS

BACKGROUND OF THE INVENTION

1. Field of the Invention

The present invention relates to a high efficiency power amplifying apparatus having a class D power amplifier, and more particularly relates to a low noise, high efficiency power amplifying apparatus suitable for audio signal amplification.

2. Description of the Related Art

High efficiency power amplifiers according to the related art that are used to drive loudspeakers typically use some type of class D power amplifier as a power amplifier with high power efficiency suitable for audio signal amplification. A high efficiency power amplifying apparatus using this type of class D power amplifier according to the related art is therefore described below with reference to the accompanying figures.

FIG. 15 shows a typical class D power amplifier and loudspeaker arrangement according to the related art. Shown in FIG. 15 are: a signal input terminal 301, class D power amplifier 302, class D power amplifier output terminal 304, positive supply terminal 305 and negative supply terminal 306 for the class D power amplifier 302, passive low-pass filter 307, speaker input terminal 303, and speaker 326. The passive low-pass filter 307 further comprises coils 310A, 310B, and 310C, and capacitors 311A, 311B, and 311C.

A high efficiency power amplifying apparatus thus comprised according to the related art operates as described below.

An audio signal input to the signal input terminal 301 is first power amplified by the class D power amplifier 302 using pulse width modulation (PWM) with a switching operation. A heavily pulse-width modulated carrier signal is therefore output from the output terminal 304 of the class D power amplifier 302. To remove this modulated carrier signal, the passive low-pass filter 307 operates as a sharp six-stage Butterworth type filter having three coil and capacitor stages.

A typical filter characteristic is shown in FIG. 16. As will be known from FIG. 16, the cut-off frequency (fc) of the filter is normally set somewhere above 20 kHz, that is, above the highest audio signal frequency, so that the audio signal is passed to the speaker without attenuation. If the PWM carrier frequency is 200 kHz, for example, attenuation, which is determined by the characteristics of the low-pass filter, is limited (−60 dB, for example). The PWM carrier frequency component at the speaker input terminal 303 is thus input to the speaker 326 as residual noise.

With a high efficiency power amplifying apparatus according to the related art as described above, a limited amount of residual noise from the PWM carrier frequency component is superimposed on the audio signal no matter how sharp the filter characteristics of the passive low-pass filter 307. This noise component is emitted from the speaker wire as high frequency noise that can adversely affect all kinds of electronics. Expensive coils and capacitors are also needed to build a high order passive low-pass filter, and high costs are must therefore be incurred to achieve an anti-noise filter.

With consideration for the above-noted problems, an object of the present invention is therefore to provide a high efficiency power amplifying apparatus in which the use of expensive passive filters is minimized, and which achieves less high frequency noise at a lower cost than a high efficiency power amplifying apparatus according to the related art.

SUMMARY OF THE INVENTION

To achieve the above object, a high efficiency power amplifying apparatus according to a first aspect of the present invention is directed to a high efficiency power amplifying apparatus for power amplifying an input signal applied to a signal input terminal wherein a PWM power amplifier power amplifies an input signal from a signal input terminal by pulse width modulation. A passive low-pass filter demodulates and outputs a pulse width modulated signal output from the PWM power amplifier. A positive floating voltage supply shifts a demodulated signal output from the passive low-pass filter a predetermined voltage +DV to supply a forward current. A negative floating voltage supply shifts a demodulated signal output from the passive low-pass filter a predetermined voltage −DV to supply a reverse current. A linear voltage amplifier having a linear circuit configuration voltage amplifies an input signal from the signal input terminal, shifts the amplified signal a predetermined voltage +dV and −dV, and outputs the shifted amplified signals. An output device then current amplifies the +dV shifted voltage amplified signal by the forward current to generate a forward current amplified signal, current amplifies the −dV shifted voltage amplified signal by said reverse current to generate a reverse current amplified signal, and applies the forward current amplified signal and reverse current amplified signal in a push-pull fashion to generate a power amplified signal.

In a high efficiency power amplifying apparatus for power amplifying an input signal applied to a signal input terminal according to a second aspect of the present invention, a first bias supply applies a forward bias voltage to an input signal from the signal input terminal. A first PWM power amplifier for power amplifies the forward biased input signal by pulse width modulation to generate a first PWM signal. A first passive low-pass filter demodulates the first PWM signal to generate and output a first demodulated signal. A second bias supply applies a reverse bias voltage to an input signal from the signal input terminal. A second PWM power amplifier power amplifies the reverse biased input signal by pulse width modulation to generate a second PWM signal. A second passive low-pass filter demodulates the second PWM signal to generate and output a second demodulated signal. A linear voltage amplifier having a linear circuit voltage amplifies an input signal from the signal input terminal, shifts the amplified signal a predetermined voltage +dV and −dV, and outputs the shifted amplified signals. An output device current amplifies a +dV shifted voltage amplified signal by the first demodulated signal to generate a forward current amplified signal, current amplifies a −dV shifted voltage amplified signal by the second demodulated signal to generate a reverse current amplified signal, and applies the forward current amplified signal and reverse current amplified signal in a push-pull fashion to generate a power amplified signal.

In a high efficiency power amplifying apparatus according to either of the above preferred versions of the present invention, the output device is preferably a push-pull circuit comprising a complementary-symmetry circuit.

Yet further preferably, the linear voltage amplifier and output device function as a class B power amplifier, a class AB power amplifier, or a class A power amplifier.

Yet further preferably, the passive low-pass filter comprises a spiral shaped electrode formed on a substrate. In this case, the spiral shaped electrode is also preferably a copper foil pattern forming a coil.

In a further preferred version of the invention, a high efficiency power amplifying apparatus according to either the first or second aspect described above further preferably comprises an input control circuit for controlling input of the input signal from the signal input terminal to the PWM power amplifier and linear voltage amplifier; a first operation control circuit for controlling operation of the PWM power amplifier; a second operation control circuit for controlling operation of the linear voltage amplifier; and a control circuit for detecting start and stop of power supply from an external source, and controlling operation of the input control circuit, first operation control circuit, and second operation control circuit according to the detected result.

In this case, the control circuit, after detecting a power supply start, causes the input control circuit to interrupt supplying the input signal from the signal input terminal to the PWM power amplifier and linear voltage amplifier for a predetermined time t1, causes the first operation control circuit to interrupt signal output from the PWM power amplifier for a predetermined time t2, and causes the second operation control circuit to interrupt signal output from the linear voltage amplifier for a predetermined time t3.

In this version of the invention, times t1, t2, and t3 used by the control circuit are preferably in the relationship t1>t3>t2.

Yet further preferably, the control circuit, after detecting a power supply stop, causes the input control circuit to immediately interrupt supplying the input signal from the signal input terminal to the PWM power amplifier and linear voltage amplifier, causes the first operation control circuit to interrupt signal output from the PWM power amplifier after a predetermined time t4, and causes the second operation control circuit to interrupt signal output from the linear voltage amplifier after a predetermined time t5.

Times t4 and t5 used by the control circuit in this version are preferably in the relationship t4>t5.

The PWM power amplifier connected to the signal input terminal is a class D power amplifier, and the linear voltage amplifier connected to the signal input terminal and the output device form a linear power amplifier. The output device is a complementary-symmetry output device equivalently operating as an active filter.

The power efficiency of a high efficiency power amplifying apparatus thus comprised according to the present invention is the sum of the power loss of the class D power amplifier and linear power amplifier. If the voltage of the positive floating voltage supply and negative floating voltage supply driving the complementary-symmetry output device of the linear power amplifier can be set to the lowest possible voltage, the power loss of the linear power amplifier can be minimized, and the normal high efficiency of a class D power amplifier is not lost. The structure can be further minimized by using a pair of coil, capacitors, and resistors which are forming a passive filter. The limits of passive filter characteristics can be overcome by using the complementary-symmetry output device of the linear power amplifier as an equivalent active filter, and an extremely high attenuation characteristic can be achieved for removing the PWM carrier frequency component. It is therefore possible to reproduce an audio signal with substantially no high frequency noise at the output terminal of the high efficiency power amplifying apparatus.

The input control circuit connected to the signal input terminal is a first muting circuit, the first operation control circuit is a second muting circuit, and the second operation control circuit is a third muting circuit. By controlling signal input from the signal input terminal, and the operation of the class D power amplifier and linear voltage amplifier when the power supply is turned on and off, extraneous signal output can be prevented. When used for power amplification of audio signals input from the signal input terminal, for example, irritating popping noises caused by the power supply switching on and off can be prevented.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DESCRIPTION OF THE PREFERRED EMBODIMENTS

The preferred embodiments of the present invention are described in detail below with reference to the accompanying figures.

Embodiment 1

Figure 1:
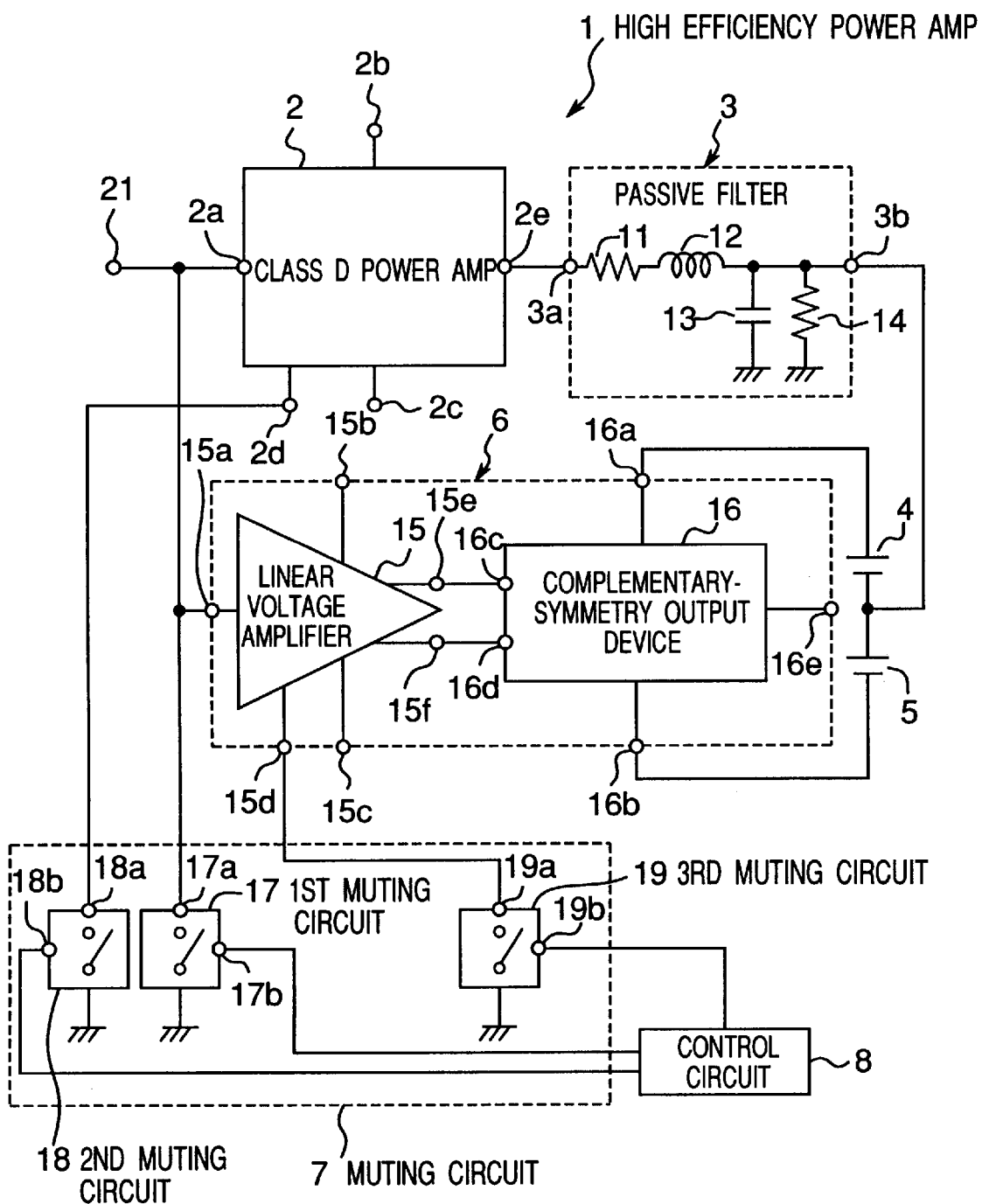
FIG. 1 is a block diagram showing the basic configuration of a high efficiency power amplifying apparatus according to a first embodiment of the present invention.

FIG. 1 is a block diagram showing the basic configuration of a high efficiency power amplifying apparatus according to a first embodiment of the present invention.

As shown in FIG. 1, a high efficiency power amplifying apparatus 1 according to the present invention comprises: a class D power amplifier 2 for audio signal power amplification; a passive filter 3, which is a low-pass filter for removing any unnecessary modulated carrier signal in the output from the class D power amplifier 2; a positive floating voltage supply 4; a negative floating voltage supply 5; a linear power amplifier 6 for audio signal power amplification; a muting circuit section 7 comprising a plurality of muting circuits; and a control circuit 8 for controlling operation of the muting circuit section 7 according to the on/off state of the AC power supply to the power supply circuit (not shown in the figures), which supplies power to the high efficiency power amplifying apparatus 1 according to the position (operation) of a power switch (not shown in the figures).

The passive filter 3 comprises a resistor 11 and coil 12 in a series circuit with a capacitor 13 and terminating resistor 14 parallel connected to this series circuit.

The linear power amplifier 6 comprises a linear voltage amplifier 15 with a linear circuit design, and a complementary-symmetry output device 16 comprising a complementary-symmetry circuit functioning as a push-pull circuit. The complementary-symmetry output device 16 supplies current to the speaker (not shown in the figures) according to the audio signal that is voltage amplified by the linear voltage amplifier 15.

The muting circuit section 7 is used to prevent irritating popping noise that can occur when the power is turned on and off. It comprises a three muting circuits, first muting circuit 17, second muting circuit 18, and third muting circuit 19. signal input terminal 21 of the high efficiency power amplifying apparatus 1 is connected to input terminal 2a of the class D power amplifier 2, to input terminal 15a of the linear voltage amplifier 15, and to the output terminal 17a of the first muting circuit 17.

The class D power amplifier 2 further comprises positive supply terminal 2b, negative supply terminal 2c, control input terminal 2d to which the muting operation control signal is input, and output terminal 2e, which is connected to the input terminal 3a of the passive filter 3.

The positive floating voltage supply 4 is connected between the output terminal 3b of the passive filter 3 and positive supply terminal 16a of the complementary-symmetry output device 16. The negative floating voltage supply 5 is connected between the output terminal 3b of the passive filter 3 and the negative supply terminal 16b of the complementary-symmetry output device 16.

The linear voltage amplifier 15 further comprises positive supply terminal 15b, negative supply terminal 15c, control input terminal 15d to which the muting operation control signal is applied, and two output terminals 15e and 15f. The output terminals 15e and 15f are connected input terminals 16c and 16d, respectively, of the complementary-symmetry output device 16. A speaker is connected to the output terminal 16e of the complementary-symmetry output device 16.

The output terminal 18a of the second muting circuit 18 is connected to control input terminal 2d of class D power amplifier 2. The output terminal 19a of the third muting circuit 19 is connected to control input terminal 15d of the linear voltage amplifier 15. Control signals controlling operation of the first muting circuit 17, second muting circuit 18, and third muting circuit 19 are applied to the respective control input terminals 17b, 18b, and 19b. The control input terminals 17b, 18b, and 19b are each connected to the control circuit 8.

Figure 2:
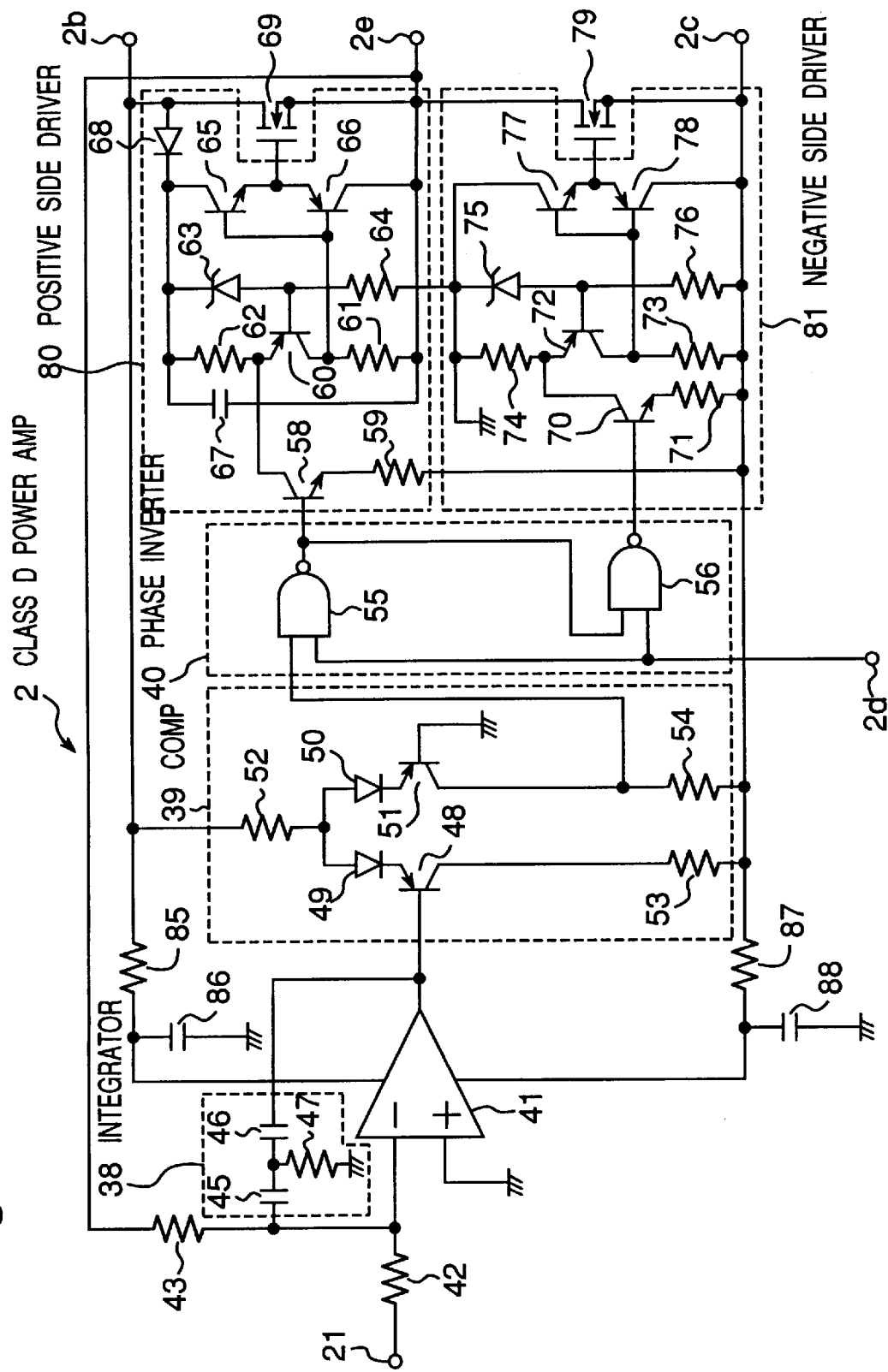
FIG. 2 is a typical circuit diagram of the class D power amplifier 2 shown in FIG. 1.

FIG. 2 is a typical circuit diagram of the class D power amplifier 2 shown in FIG. 1. A class D power amplifier 2 in this first preferred embodiment of the present invention is a PWM power amplifier for power amplification by means of pulse width modulation. The basic operation of the class D power amplifier 2 is described next below.

Shown in FIG. 2 are: an operational amplifier 41; resistors 42 and 43, which determine the voltage gain of the class D power amplifier 2; and an integrator 38 comprising capacitors 45 and 46 and resistor 47. The integrator 38 and operational amplifier 41 form an integrating circuit. In addition, a comparator 39 comprises pnp transistors 48 and 51, diodes 49 and 50, and resistors 52, 53, and 54; and a phase inverter 40 for generating a phase inversion pulse comprises NAND gates 55 and 56. A control signal for controlling the PWM carrier switching of class D power amplifier 2 is applied through control signal input terminal 2d. Though not shown in FIG. 2, the control input terminal 2d is pulled up by, for example, the pull-up resistors in the class D power amplifier 2.

An n-channel power MOS transistor 69 functions as a positive power switch. A positive side driver 80 for switching the n-channel power MOS transistor 69 on and off comprises npn transistors 58 and 65, pnp transistors 60 and 66, resistors 59, 61, 62, and 64, diodes 63 and 68, and capacitor 67.

An n-channel power MOS transistor 79 functions as a negative power switch. A negative side driver 81 for switching the n-channel power MOS transistor 79 on and off comprises npn transistors 70 and 77, pnp transistors 72 and 78, resistors 71, 73, 74, and 76, and Zener diode 75.

An audio signal input from the signal input terminal 21 is converted to a sawtooth wave by the integrating circuit formed by the integrator 38 and operational amplifier 41. This sawtooth wave is then converted to a rectangular wave by comparator 39. When the control input terminal 2d is pulled down, both NAND gates 55 and 56 of the phase inverter 40 go high, and signal output from the output terminal 2e stops.

Figure 3:
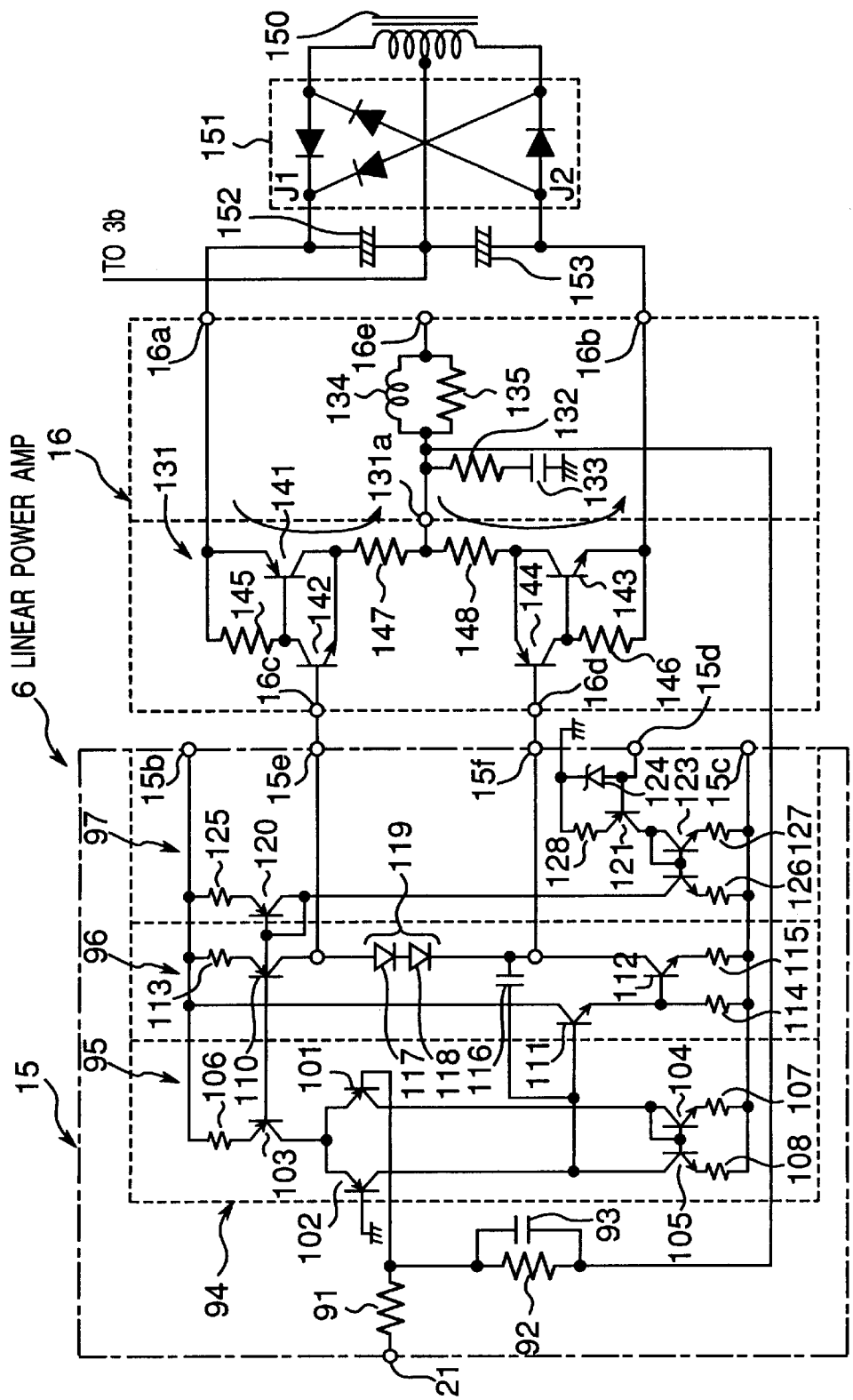
FIG. 3 is a typical circuit diagram showing the basic configuration of the linear power amplifier 6 shown in FIG. 1.

FIG. 3 is a typical circuit diagram showing the basic configuration of the linear power amplifier 6 shown in FIG. 1.

Referring to FIG. 3, a linear voltage amplifier 15 comprises resistors 91 and 92, capacitor 93, and operational amplifier 94. The operational amplifier 94 comprises a first voltage amplifier stage 95, second voltage amplifier stage 96, and bias current generator 97. Resistors 91 and 92 determine the voltage gain of the linear power amplifier 6. Capacitor 93 is a phase compensation capacitor.

The first voltage amplifier stage 95 comprises pnp transistors 101 to 103, npn transistors 104 and 105, and resistors 106 to 108; pnp transistors 101 and 102 form a differential amplifier, and npn transistors 104 and 105 form a current mirror circuit. The base of pnp transistor 101 is the inverting input terminal of operational amplifier 94, and the base of pnp transistor 102 is the non-inverting input terminal of the operational amplifier 94.

The second voltage amplifier stage 96 comprises pnp transistor 110, npn transistors 111 and 112, resistors 113 to 115, capacitor 116, and diodes 117 and 118. The capacitor 116 is a phase compensating capacitor, and functions as the controlling pole of the linear voltage amplifier 15. Diodes 117 and 118 form a constant voltage bias diode group 119 that determines the bias current of the complementary-symmetry output device 16.

The bias current generator 97 comprises pnp transistors 120 and 121, npn transistors 122 and 123, Zener diode 124, and resistors 125 to 128. The npn transistors 122 and 123 form a current mirror circuit; pnp transistors 103, 110, and 120, and resistors 106, 113, and 125 form a constant current supply.

When a negative bias voltage is applied to the control input terminal 15*d*, a constant current is supplied from pnp transistors 103, 110, 120. When control input terminal 15*d* is grounded, the constant current supply from pnp transistors 103, 110, 120 stops, and first voltage amplifier stage 95 and second voltage amplifier stage 96 stop operating. Signal output from output terminals 15*e* and 15*f* of the linear voltage amplifier 15 thus stops.

The complementary-symmetry output device 16 comprises a complementary-symmetry circuit as a push-pull circuit 131; a resistor 132 and capacitor 133 for assuring the load stability of the complementary-symmetry output device 16; and a coil 134 and damping resistor 135 for assuring the stability of the speaker load. The push-pull circuit 131 comprises a pnp power transistor 141, an npn transistor 142 for driving the pnp power transistor 141, an npn power transistor 143, a pnp transistor 144 for driving the npn power transistor 143, and resistors 145 to 148.

Power transistors 141 and 143 are complementary, and transistors 142 and 144 are likewise complementary. Resistor 145 provides the collector resistance of npn transistor 142, and resistor 146 provides the collector resistance of pnp transistor 144. Resistor 147 is both the collector resistance of pnp power transistor 141 and the emitter resistance of npn transistor 142. Resistor 148 is both the collector resistance of npn power transistor 143 and the emitter resistance of pnp transistor 144.

Transformer 150, diode bridge circuit 151, and smoothing capacitors 152 and 153 form a floating voltage supply. Capacitor 152, transformer 150, and bridge circuit 151 correspond to the positive floating voltage supply 4 shown in FIG. 1, and capacitor 153, transformer 150, and bridge circuit 151 correspond to the negative floating voltage supply 5 shown in FIG. 1.

A forward current flowing from the emitter of pnp power transistor 141 to the collector, and then to the output terminal 131*a* of the push-pull circuit 131, is supplied from node J1 of bridge circuit 151. A reverse current flowing from the output terminal 131*a* of push-pull circuit 131 to the collector of npn power transistor 143, then from the collector of npn power transistor 143 through the emitter to node J2, is simultaneously supplied from node J2 of the bridge circuit 151. The currents flowing through pnp power transistor 141 and npn power transistor 143 are thus in a push-pull relationship.

The operation of a high efficiency power amplifying apparatus 1 thus comprised is described next below.

An audio signal input to the signal input terminal 21 is simultaneously applied to the class D power amplifier 2 and linear voltage amplifier 15. The class D power amplifier 2 uses half-bridge type high speed switching power MOS transistors 69 and 79 to operate as a high speed, high efficiency PWM switching amplifier.

Figure 4A:
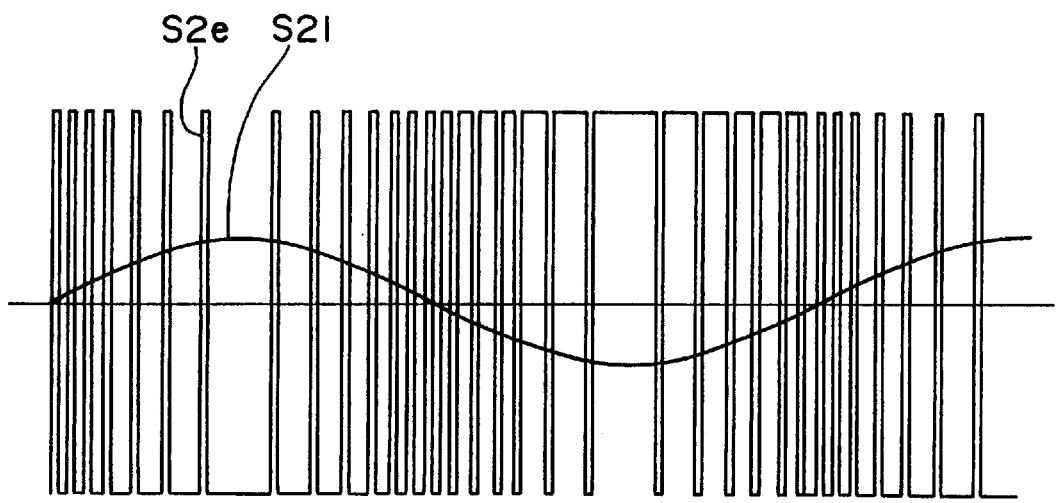
FIGS. 4A and 4B are signal waveform diagrams of signals at major points in FIG. 1.
Figure 4B:
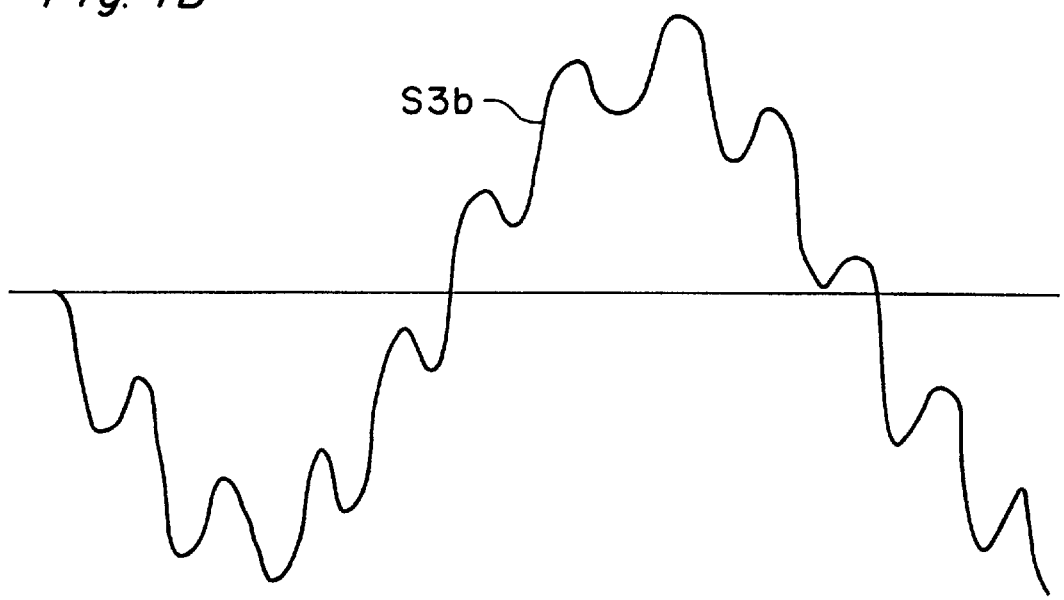

Wave S21 in FIG. 4(*a*) is the audio signal (shown by way of example as a simple sine wave) input to the signal input terminal 21, and wave S2*e* is the PWM modulated output wave after power amplification by the class D power amplifier 2. Wave S3*b* in FIG. 4(*b*) is the output wave from the output terminal 3*b* of passive filter 3. The passive filter passive filter 3 demodulates the PWM signal to restore the original audio signal, except that, as shown in FIG. 4(*b*), a high frequency noise component is superimposed on the original audio signal.

Figure 5:
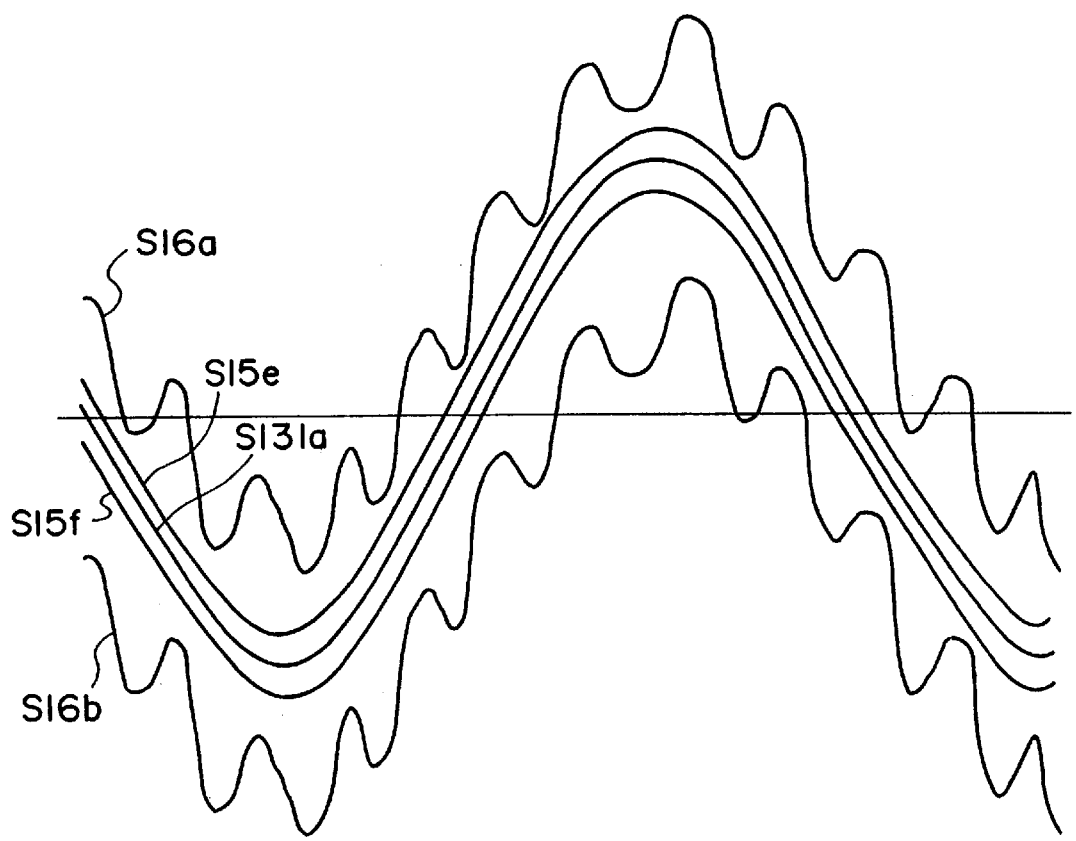
FIG. 5 is a signal waveform diagram of signals at major points in FIG. 1.

The audio signal input to the linear power amplifier 6 is voltage amplified by the linear voltage amplifier 15 shown in FIG. 3. A bias voltage of +dV and −dV (+5V and −5V, for example) is added by the constant voltage bias diode group 119 of diodes 117 and 118, generating the high side voltage amplified signal S15*e* output from output terminal 15*e*, and the low side voltage amplified signal S15*f* output from output terminal 15*f*, as shown in FIG. 5. The high side voltage amplified signal S15*e* and low side voltage amplified signal S15*f* are offset shifted by a 2 dV voltage potential, each having the same waveform as the input signal S21. Signal S15*e* is applied to input terminal 16*c*, and signal S15*f* is applied to input terminal 16*d*, of the complementary-symmetry output device 16.

Signal S3*b* from output terminal 3*b* of the passive filter 3 is forward and reverse shifted, and applied respectively to the positive supply terminal 16*a* and negative supply terminal 16*b* of the complementary-symmetry output device 16. More specifically, signal S3*b* is shifted by capacitors 152 and 153 +DV and −DV (+10V and −10V, for example), and the resulting signals are applied to the supply terminals 16*a* and 16*b*. Wave S16*a* and S16*b* in FIG. 5 represent the voltage waves applied to supply terminals 16*a* and 16*b*, and as will be known from FIG. 5 have the same waveform. As will also be known from FIG. 5, waves S16*a* and S16*b* are preferably as close as possible to, and above and below waves S15*e* and S15*f* while not overlapping.

Of the audio signals voltage amplified by the linear voltage amplifier 15, wave S15*e* represents the current amplified output of the pnp power transistor 141. This current is a forward current supplied from node J1 of bridge circuit 151, and flows from the emitter of pnp power transistor 141 to the collector, and to the output terminal 131*a* of the push-pull circuit 131. Wave S15*f* likewise represents the current amplified signal of npn power transistor 143. Current in this case is supplied from node J2 of the bridge circuit 151, and is a reverse current supplied from the output terminal 131*a* of push-pull circuit 131 to the collector of npn power transistor 143, and from the collector to the emitter.

More specifically, the pnp power transistor 141 current amplifies the high side voltage amplified signal S15*e* using the forward current from node J1, and thus generates a forward current amplified signal. The npn power transistor 143 current amplifies the low side voltage amplified signal S15*f* using the reverse current from node J2, and thus generates a reverse current amplified signal. These forward and reverse current amplified signals are applied in a push-pull fashion, and a power amplified signal is output from the output terminal 131*a*.

Because the power transistors 141 and 143 are configured in a push-pull design, the current flowing to pnp power transistor 141 and the current flowing to npn power transistor 143 is added to obtain the average current, which is output from the output terminal 131*a* of push-pull circuit 131. The voltage signal wave from push-pull circuit 131 is thus shown as wave S131*a* in FIG. 5, which is the midpoint between waves S15*e* and S15*f*.

Audio signal S21 can thus be faithfully power amplified. In addition, because the current supply for power amplification is limited to between waves S16*a* and S16*b*, the supply source current can be controlled to a low supply power when the current requirement is low, and to a high supply power when the current requirement is high. Current supply efficiency can thus be improved.

A more specific example is described next below. The PWM switching carrier frequency with no signal can be set to approximately 500 kHz, significantly greater than the 20 kHz upper limit of the audio signal frequency range. It is also possible to develop a power amplifier with nearly 90% power efficiency. The voltage gain of this self-excited class D power amplifier 2 is determined by the ratio between resistor 42 and resistor 43. If the resistance of resistor 42 is R42, and the resistance of resistor 43 is R43, then the voltage gain of the class D power amplifier 2=R43/R42.

As noted above, the audio signal input to the linear power amplifier 6 is voltage amplified by the linear voltage amplifier 15. Voltage is supplied from a fixed supply to positive supply terminal 15b and negative supply terminal 15c of the linear voltage amplifier 15. If this voltage can be supplied from a supply that is sufficiently free of high frequency noise, the linear voltage amplifier 15 can be expected to perform as a pure audio signal voltage amplifier with no high frequency noise.

Next, a pure audio signal output signal free of high frequency noise is applied to the complementary-symmetry output device 16 through output terminal 15e and output terminal 15f of the linear voltage amplifier 15. This audio signal output signal is power converted by the complementary-symmetry output device 16, and output from the output terminal 16e, which functions as the output terminal of the high efficiency power amplifying apparatus 1.

The voltage gain of this linear power amplifier 6 is determined by resistors 91 and 92. If the resistance of resistor 91 is R91, and the resistance of resistor 92 is R92, the voltage gain of the linear power amplifier 6=R92/R91.

The PWM signal at the output terminal 2e of class D power amplifier 2 is demodulated by the two-stage passive filter 3. If the PWM switching carrier frequency component can be attenuated approximately 40 dB, for example, an approximately 1V PWM switching carrier frequency component is produced at the output terminal 3b of the two-stage passive filter 3 even if the amplitude of the PWM switching pulse is ±50V, for example. It is therefore possible to assume that an audio output signal with the same PWM switching carrier frequency component is applied by way of the positive floating voltage supply 4 and negative floating voltage supply 5 to the positive supply terminal 16a and negative supply terminal 16b of the complementary-symmetry output device 16.

If the voltage gain (=R43/R42) of the class D power amplifier 2, and the voltage gain (=R92/R91) of the linear power amplifier 6, is set to substantially the same voltage gain, the amplifier can operate while keeping the audio output signal at a voltage substantially midway between the positive floating voltage supply 4 and the negative floating voltage supply 5. Power loss can be minimized by minimizing the voltage of the positive floating voltage supply 4 and the voltage of the negative floating voltage supply 5. If operation is possible at ±5V, for example, power loss can be reduced to approximately 1/10 compared with a linear power amplifier operating at ±50V.

Figure 6:
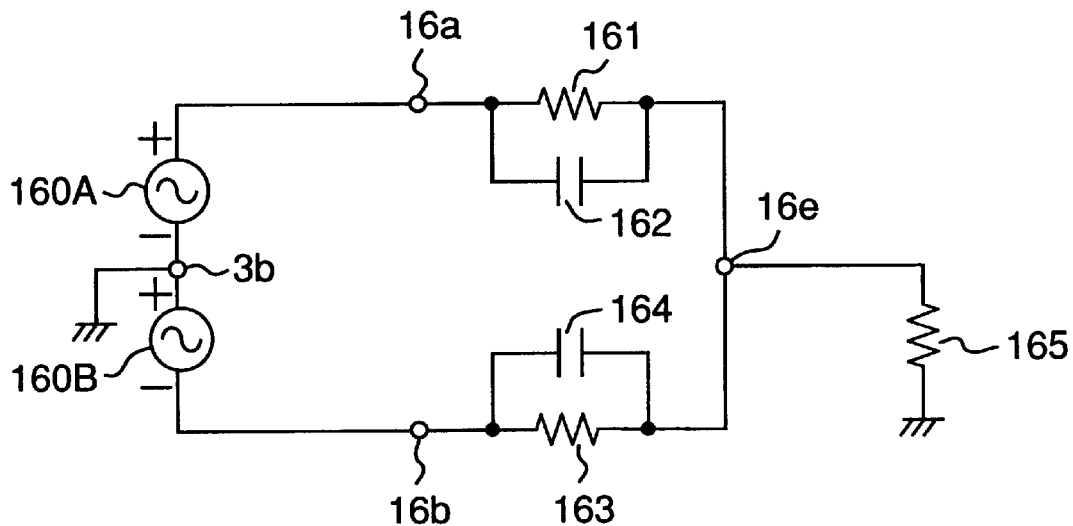
FIG. 6 is an equivalent circuit diagram used to describe the high frequency noise suppression principle of the complementary-symmetry output device 16 shown in FIG. 1.

The principle of high frequency noise suppression by the complementary-symmetry output device 16 is described next with reference to FIG. 6 and FIG. 7. FIG. 6 is an equivalent circuit diagram for describing the high frequency noise principle of the complementary-symmetry output device 16.

Shown in FIG. 6 are: a high frequency noise source 160A passing from positive floating voltage supply 4 through positive supply terminal 16a of complementary-symmetry output device 16 to output terminal 16e of high efficiency power amplifying apparatus 1; high frequency noise source 160B passing from negative floating voltage supply 5 through negative supply terminal 16b of complementary-symmetry output device 16 to the output terminal 16e of high efficiency power amplifying apparatus 1; positive equivalent output resistor 161 of the complementary-symmetry output device 16; positive equivalent output capacitance 162 of complementary-symmetry output device 16; negative equivalent output resistor 163 of the complementary-symmetry output device 16; negative equivalent output capacitance 164 of complementary-symmetry output device 16; and speaker terminal load resistance 165.

The operation of the equivalent circuit shown in FIG. 6 is described next. If output terminal 3b of two-stage passive filter 3 is a virtual ground, high frequency noise source 160A and high frequency noise source 160B are mutually inverse phase components. Therefore, if positive equivalent output resistor 161 and positive equivalent output capacitance 162 of complementary-symmetry output device 16, and negative equivalent output resistor 163 and negative equivalent output capacitance 164 of complementary-symmetry output device 16, are extremely well matched, a large attenuation factor can be achieved from a low frequency range to a high frequency range. A feedback type circuit with a high equivalent output resistance as in the present embodiment is therefore excellent as the circuit configuration of a complementary-symmetry output device 16 for effectively suppressing high frequency noise. In addition, considering the physical structure of a silicon power transistor, stray capacitance between the ground and collector is greater than between the ground and emitter because the collector is on the back side of the silicon. High frequency noise can therefore be better suppressed with the emitter at the high frequency noise source because of the lower stray capacitance to the ground.

Even more specifically, if the positive equivalent output resistor 161 is 10 kΩ, the negative equivalent output resistor 163 is 9 kΩ, and the speaker terminal load resistance 165 is 10 Ω, for example, the high frequency noise suppression ratio will be 80 dB, and if the noise source has a 1 V amplitude, noise can be suppressed to 1/10,000, or to 100 μV.

Figure 7:
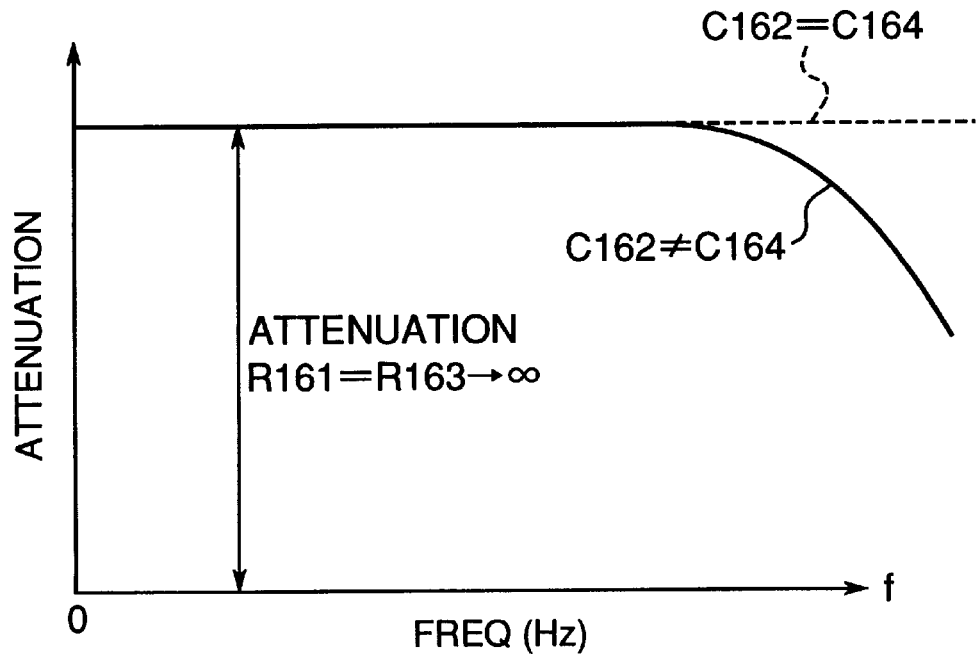
FIG. 7 shows the attenuation frequency characteristic of the complementary-symmetry output device 16 shown in FIG. 1.

FIG. 7 shows the frequency characteristic of complementary-symmetry output device 16 attenuation. As will be known from FIG. 7, if the positive equivalent output capacitance 162 and negative equivalent output capacitance 164 are perfectly matched, reliable attenuation to an infinite frequency can be expected.

Operation at the start and stop of AC power supply to the power supply circuit (not shown in the figures) for supplying power to the high efficiency power amplifying apparatus 1 when the power switch (not shown in the figures) is operated is described next. The control circuit 8 detects the start and stop of AC power supply, and outputs a specific signal to the control input terminals 17b, 18b, and 19b of the first to third muting circuits 17 to 19 according to the detected start or stop of AC power supply.

When a specific signal indicating the start or stop of AC power supply, for example, a high signal, is applied by the control circuit 8 to the control input terminal 17b of the first muting circuit 17, signal input terminal 21 is grounded for as long this high signal is applied. Output terminal 17a of the first muting circuit 17 is open when this specific signal is not applied from the control circuit 8.

When a specific signal indicating the start or stop of AC power supply, for example, a high signal, is applied by the control circuit 8 to the control input terminal 18b of the second muting circuit 18, control input terminal 2d of the class D power amplifier 2 is grounded for as long this high signal is applied, and signal output from output terminal 2e of class D power amplifier 2 stops.

When this specific signal is not applied from the control circuit 8 to the second muting circuit 18, the output terminal 18a thereof is open, and the class D power amplifier 2 applies class D power amplification to the signal input from the input terminal 2a and outputs the amplified signal. Note that when this specific signal is not applied from the control circuit 8, the control input terminal 2d of class D power amplifier 2 can be designed to be pulled up by the second muting circuit 18. In this case, it is not necessary to pull up the control input terminal 2d of the class D power amplifier 2.

When a specific signal indicating the start or stop of AC power supply, for example, a high signal, is applied by the control circuit 8 to the control input terminal 19b of the third muting circuit 19, control input terminal 215d of the linear voltage amplifier 15 is grounded for as long this high signal is applied, and signal output from output terminals 15e and 15f of the linear voltage amplifier 15 stops.

When this specific signal is not applied from the control circuit 8 to the third muting circuit 19, a predetermined negative voltage is applied to control input terminal 15d of linear voltage amplifier 15, and the linear voltage amplifier 15 power amplifies and outputs the signal input from the input terminal 15a. Note that the control input terminal 15d of the linear voltage amplifier 15 is grounded while this specific signal is applied from the control circuit 8 to the third muting circuit 19, and the control input terminal 15d can otherwise be connected to the negative supply terminal 15c.

Figure 8:
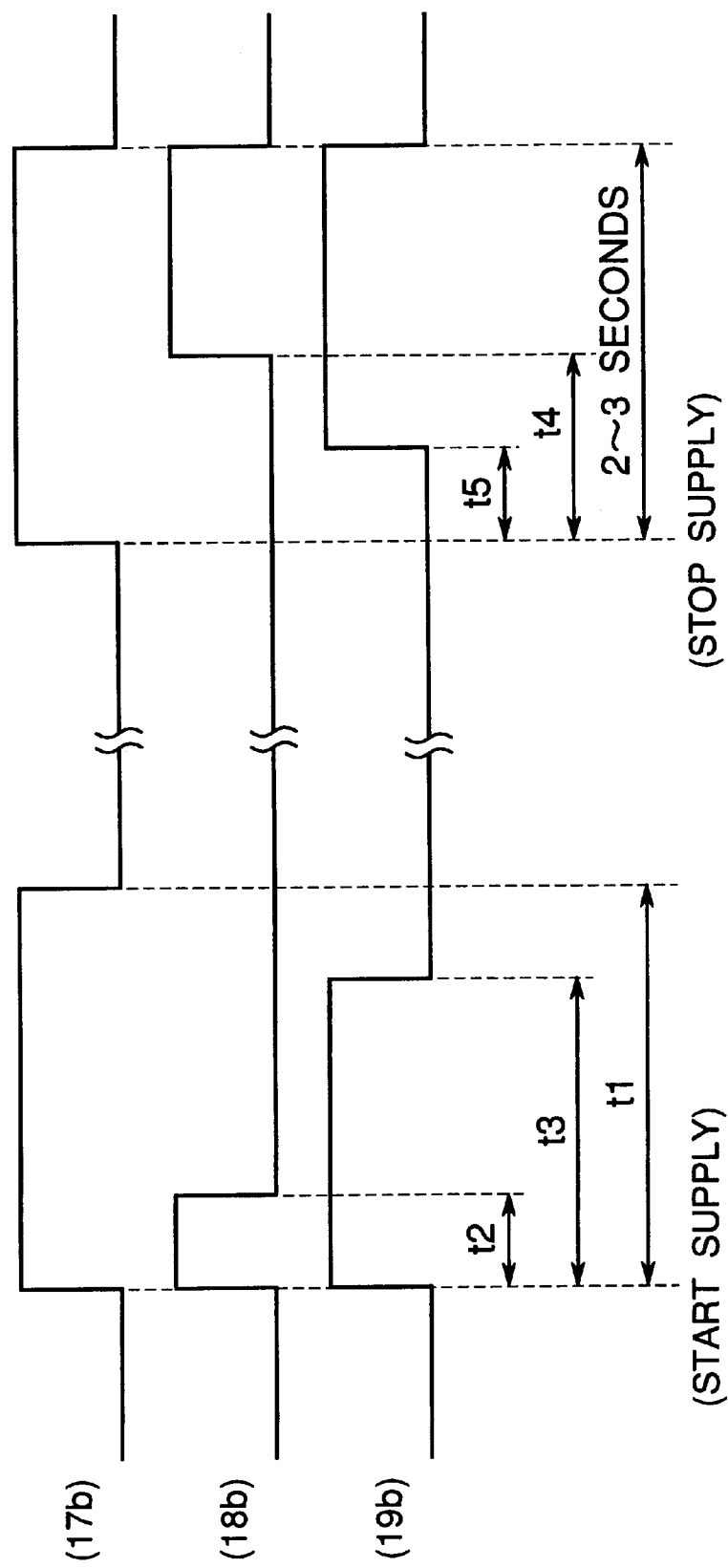
FIG. 8 is a timing chart of the control signals output from the control circuit 8 shown in FIG. 1.

FIG. 8 is a timing chart for the control signals applied from the control circuit 8 in response to power switch operation to the control input terminals 17b, 18b, and 19b of the first to third muting circuits 17 to 19. The operation of the control circuit 8 when AC power supply is stopped and started is described next with reference to FIG. 8.

As shown in FIG. 8, when the control circuit 8 detects the start of AC power supply, it applies a specific signal to the control input terminals 17b, 18b, and 19b of the first to third muting circuits 17 to 19, and signal input terminal 21, control input terminal 2d, and control input terminal 15d go to ground. As in the above examples, this specific signal is below assumed to be a high signal.

At a predetermined time t2, for example, 100 ms, after the start of AC power supply is detected, the control circuit 8 drives control input terminal 18b of second muting circuit 18 from high to low. As a result, output terminal 18a of second muting circuit 18 goes open, and the class D power amplifier 2 starts a specific amplifying operation.

At another predetermined time t3, for example, 1 sec, after the start of AC power supply is detected, the control circuit 8 drives control input terminal 19b of third muting circuit 19 from high to low. As a result, the third muting circuit 19 applies a negative bias voltage to the control input terminal 15d of linear voltage amplifier 15, and the linear voltage amplifier 15 begins a specific amplifying operation.

At another predetermined time t1, for example, 2 sec, after the start of AC power supply is detected, the control circuit 8 drives control input terminal 17b of first muting circuit 17 from high to low. The output terminal 17a of first muting circuit 17 thus goes open, the audio signal from the signal input terminal 21 is input to the input terminals 2a and 15a of the class D power amplifier 2 and linear voltage amplifier 15, respectively, and the muting operation at the start of AC power supply is cancelled.

Next, when the control circuit 8 detects that AC power supply has stopped, it applies a specific signal, again a high signal in this example, to the control input terminal 17b of the first muting circuit 17. As a result, the first muting circuit 17 grounds the signal input terminal 21.

At a predetermined time t5, 20 ms in this example, after the end of AC power supply is detected, the control circuit 8 drives the control input terminal 19b of third muting circuit 19 from low to high. The third muting circuit 19 thus grounds the control input terminal 15d of linear voltage amplifier 15.

At a further predetermined time t4, 30 ms in this example, after the end of AC power supply is detected, the control circuit 8 drives the control input terminal 18b of second muting circuit 18 from low to high. The second muting circuit 18 thus grounds the control input terminal 2d of the class D power amplifier 2.

The supply circuit for supplying power to the high efficiency power amplifying apparatus 1 can continue supplying power to the high efficiency power amplifying apparatus 1 for two to three seconds after the AC power supply is interrupted, but the power supply is thereafter stopped. As a result, the first muting circuit 17 stops connecting the signal input terminal 21 to ground and the output terminal 17a opens, thus cancelling the muting operation at the end of the AC power supply.

It is therefore possible to prevent the irritating popping noise that can be heard when the power switch is operated to turn the AC power supply on and off to the power supply circuit that supplies power to a high efficiency power amplifying apparatus 1 in response to the power switch operation.

The push-pull circuit 131 shown in FIG. 3 can also be configured for complementary-symmetry operation with a three-stage feedback type emitter-follower. A push-pull circuit 131 thus comprised is described next below with reference to a circuit diagram thereof in FIG. 9.

Figure 9:
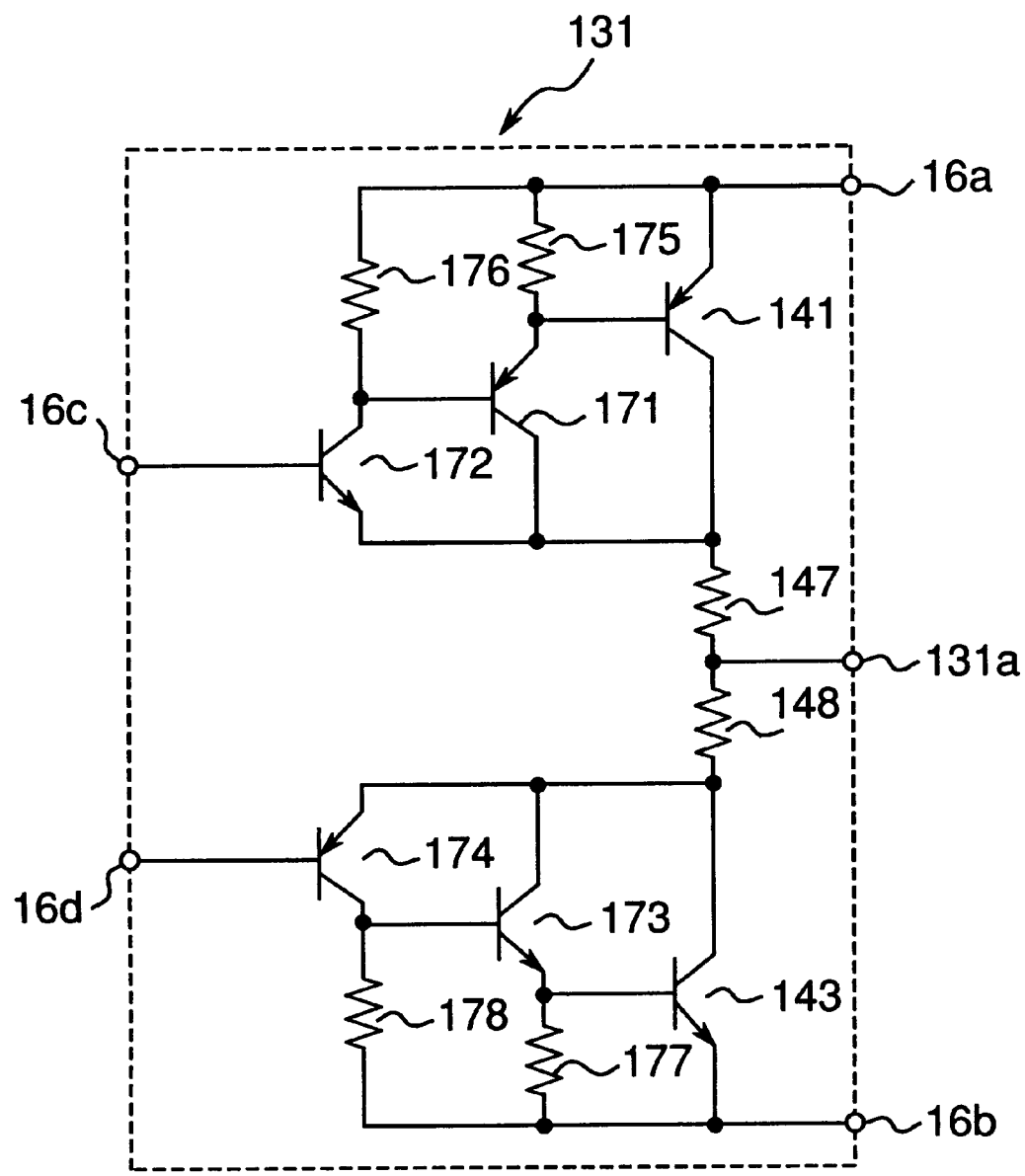
FIG. 9 is a circuit diagram of an alternative version of the push-pull circuit 131 shown in FIG. 3.

The push-pull circuit 131 shown in FIG. 9 differs from that in FIG. 3 in that the pnp power transistor 141 is driven by pnp transistor 171, and pnp transistor 171 is driven by npn transistor 172; and npn power transistor 143 is driven by npn transistor 173, and npn transistor 173 is driven by pnp transistor 174.

Transistors 171 and 173 have complementary operating characteristics, as do transistors 172 and 174. Resistor 175 is an emitter resistance for pnp transistor 171, and resistor 176 is a collector resistance for npn transistor 172. In addition, resistor 177 is an emitter resistance for npn transistor 173, and resistor 178 is a collector resistance for pnp transistor 174. By thus configuring the push-pull circuit 131 as a complementary-symmetry operating three-stage feedback type emitter-follower, a complementary-symmetry output device 16 with an even greater equivalent output resistance can be achieved.

It should be further noted that while the push-pull circuit 131 shown in FIG. 3 and FIG. 9 is described by way of example as a complementary-symmetry operating feedback type emitter-follower, it can be alternatively configured as a simple complementary-symmetry operating emitter-follower. An exemplary push-pull circuit 131a forming a two-stage emitter-follower for this case is shown in FIG. 10, and an exemplary push-pull circuit 131b forming a three-stage emitter-follower for this case is shown in FIG. 11.

Figure 10:
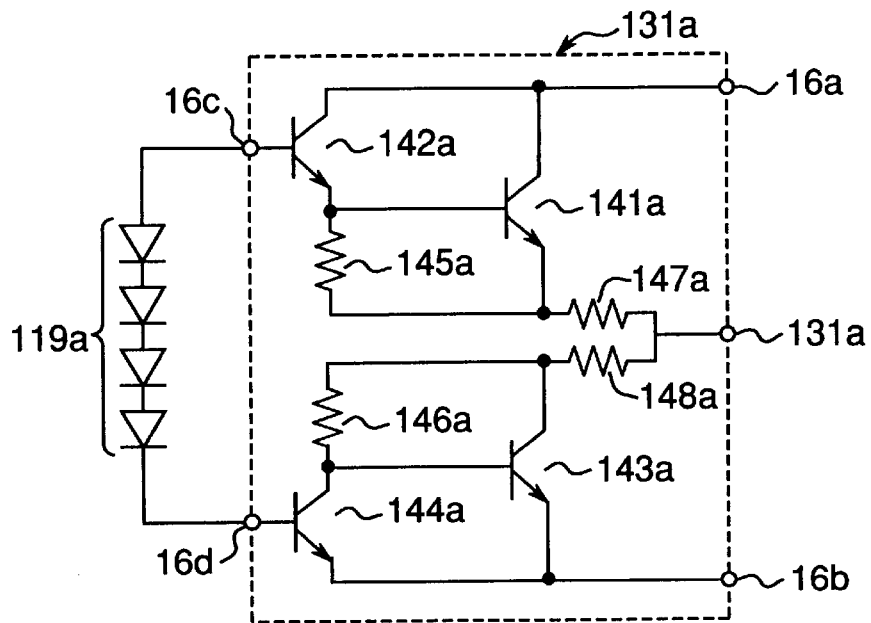
FIG. 10 is a circuit diagram of a further alternative version of the push-pull circuit 131 shown in FIG. 3.

Referring to FIG. 10, the push-pull circuit 131a comprises an npn power transistor 141a and npn transistor 142a for driving the power transistor 141a, npn power transistor 143a and npn transistor 144a for driving power transistor 143a, and resistors 145a to 148a.

Power transistors 141a and 143a have complementary operating characteristics, as do transistors 142a and 144a. Resistor 145a is an emitter resistance for npn transistor 142a, and resistor 146a is a collector resistance for npn transistor 144a and also a base resistance for power transistor 143a. Resistor 147a is an emitter resistance for power transistor 141a, and resistor 148a is a collector resistance for npn transistor 143a.

Figure 11:
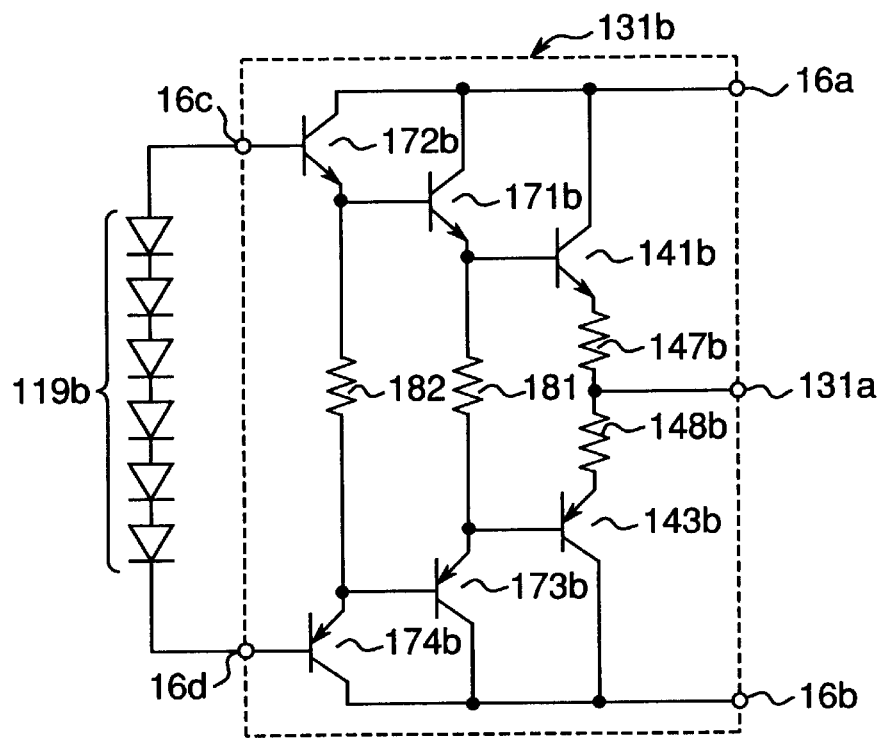
FIG. 11 is a circuit diagram of yet a further alternative version of the push-pull circuit 131 shown in FIG. 3.

Referring to FIG. 11, push-pull circuit 131b comprises pnp power transistor 141b, npn transistor 171b for driving power transistor 141b, npn transistor 172b for driving npn transistor 171b, pnp power transistor 143b, pnp transistor 173b for driving power transistor 143b, pnp transistor 174b for driving pnp transistor 173b, and resistors 147b, 148b, 181, and 182.

Power transistors 141b and 143b, transistors 171b and 173b, and transistors 172b and 174b each have complementary operating characteristics. Resistor 147b is an emitter resistance for power transistor 141b, and resistor 148b is an emitter resistance for pnp transistor 143b. Resistor 181 is an emitter resistance for transistors 171b and 173b, and resistor 182 is an emitter resistance for transistors 172b and 174b.

While the push-pull circuits shown in FIG. 10 and FIG. 11 do not have a greater equivalent output resistance than a feedback type emitter-follower, there is no concern about oscillation stability accompanying feedback, and a stable complementary-symmetry output device can be achieved. It should be further noted that, as shown in FIG. 10 and FIG. 11, a class A, class AB, or class B bias can be set by changing the bias, which can be accomplished by changing the number of diodes in the constant voltage bias diode group 119 of the linear power amplifier 6 determining the idling current of the push-pull circuit.

Figure 12:
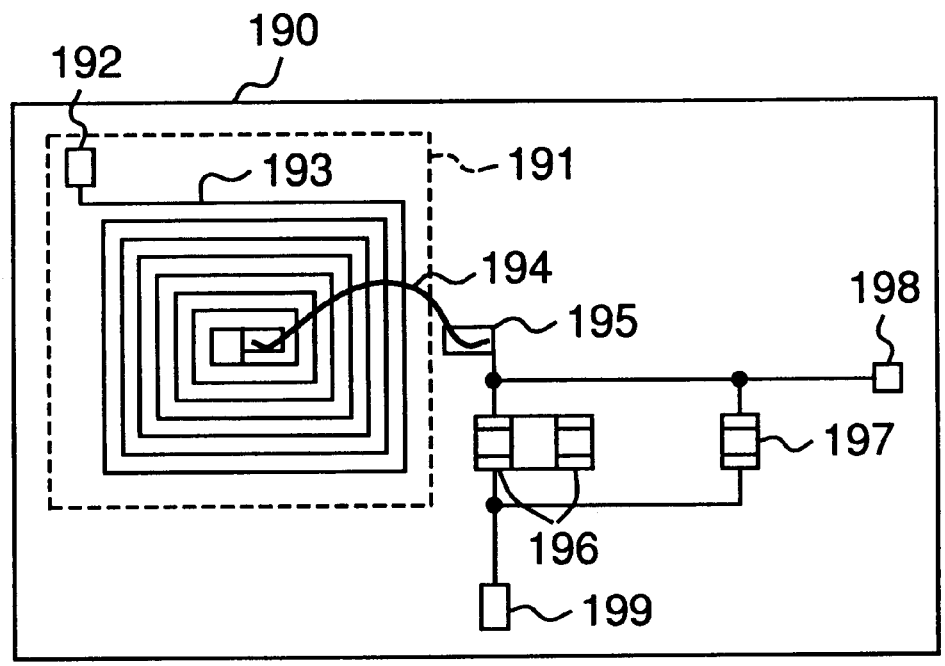
FIG. 12 shows an exemplary application of the passive filter 3 shown in FIG. 1.

A preferred embodiment of the passive filter 3 shown in FIG. 1 is shown in FIG. 12 and described below.

Figure 13:
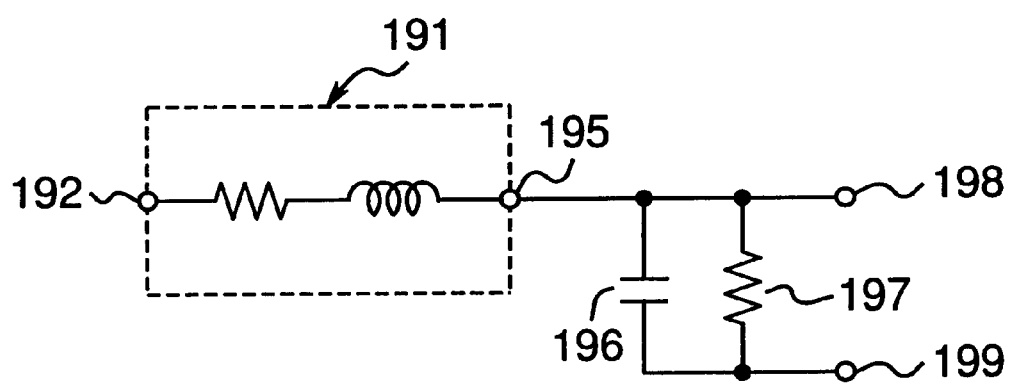
FIG. 13 is a circuit diagram of the passive filter shown in FIG. 12.

As shown in FIG. 12, an insulated copper foil pattern 191 is formed on a metallic substrate 190. Reference numeral 192 is an input terminal for the two-stage passive filter; 193 is a coil formed by a spiraling copper foil pattern having a constant pattern width; 194 is a wire bonded aluminum wire; 195 is a bonding pad; 196 is a chip capacitor; 197 is a chip resistor; 198 is an output terminal for the two-stage passive filter; and 199 is a ground contact for the two-stage passive filter. FIG. 13 is a circuit diagram for the passive filter shown in FIG. 12 where like parts are identified by like reference numerals.

FIG. 12 and FIG. 13 show the basic configuration for mounting a two-stage passive filter 3 on a metallic substrate. Using the copper foil sheet resistance and controlling the copper foil width, a coil with a specific equivalent serial resistance can be formed, and a high power chip resistance is not necessary. An extremely low cost, high reliability filter can thus be achieved using a two-stage passive filter 3 comprising a chip capacitor.

Embodiment 2

It is difficult to further increase the degree of integration and thereby lower the cost of a high efficiency power amplifying apparatus 1 according to the above first preferred embodiment of the present invention because a transformer 150, bridge circuit 151, and smoothing capacitors 152 and 153 are used to form positive floating voltage supply 4 and negative floating voltage supply 5. A high efficiency power amplifying apparatus according to this second preferred embodiment of the present invention achieves the same benefits as the first embodiment while eliminating use of components that make it difficult to achieve greater device integration.

Figure 14:
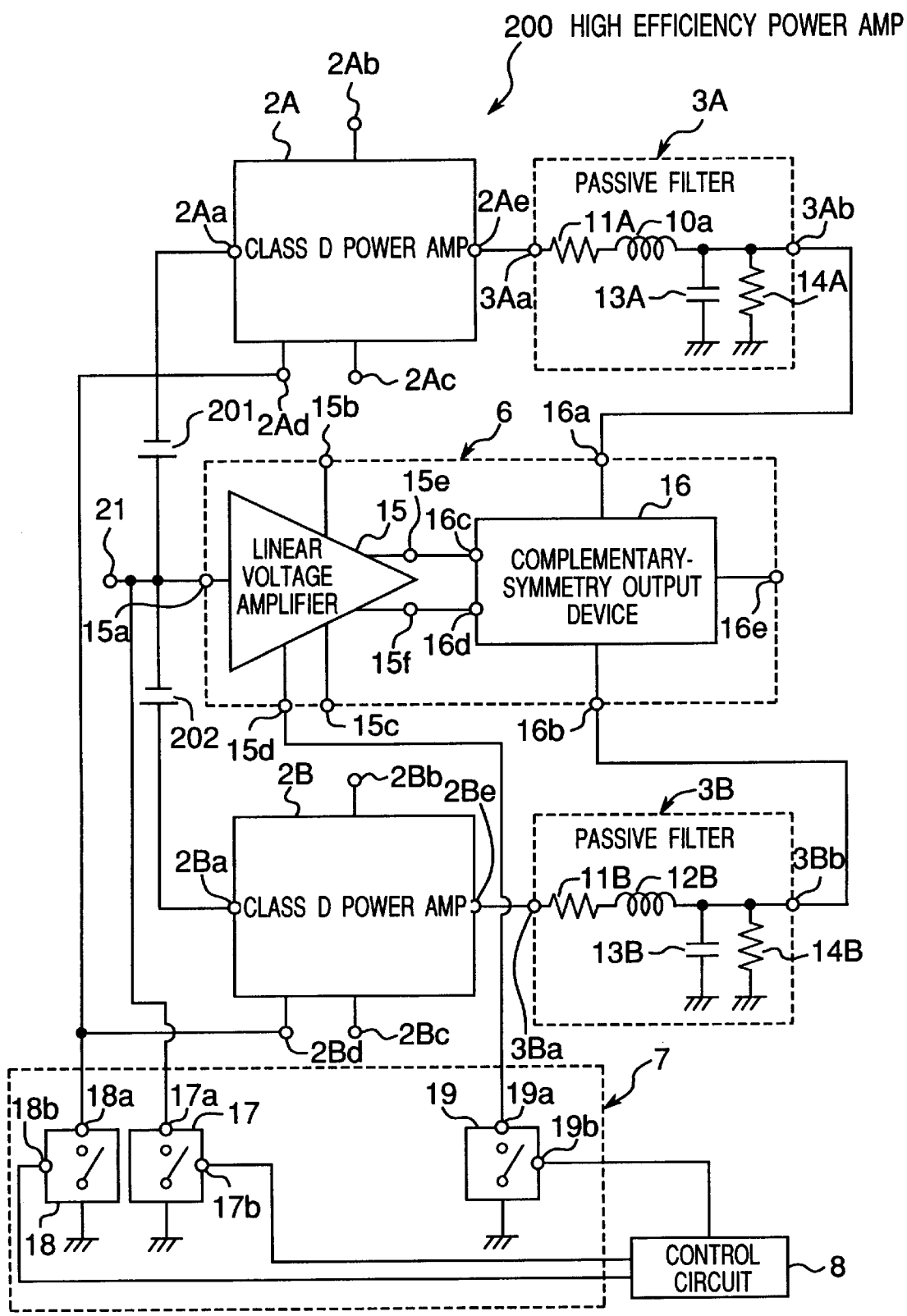
FIG. 14 is a block diagram showing the basic configuration of a high efficiency power amplifying apparatus according to a second embodiment of the present invention.
Figure 15:
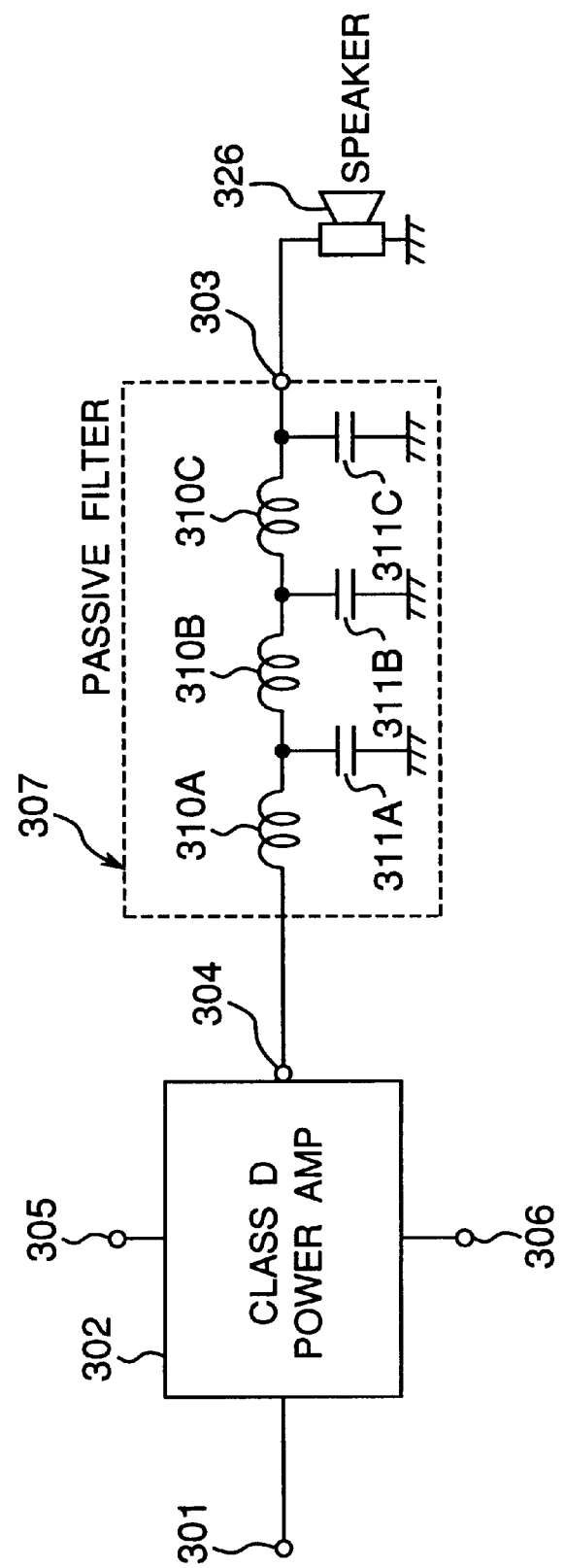
FIG. 15 shows the basic configuration of a high efficiency power amplifying apparatus according to the related art.
Figure 16:
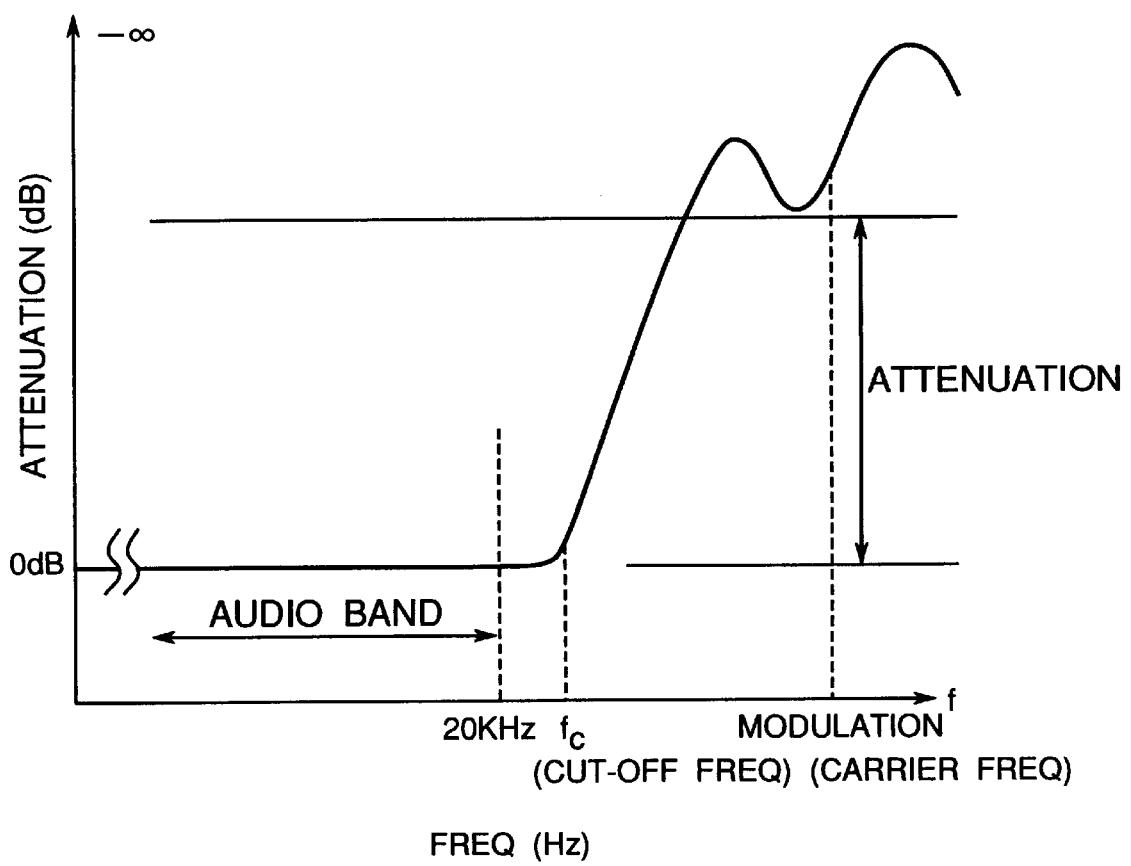
FIG. 16 is a waveform diagram showing the typical characteristics of a passive filter according to the related art.

FIG. 14 is a typical block diagram showing the basic configuration of a high efficiency power amplifying apparatus according to this second embodiment of the present invention. It should be noted that like parts in this and the first embodiment are identified by like reference numerals, and further description thereof is omitted below.

The high efficiency power amplifying apparatus 200 according to this second preferred embodiment as shown in FIG. 14 differs from that in FIG. 1 in that the positive floating voltage supply 4 and negative floating voltage supply 5 are eliminated, two qualitatively identical class D power amplifiers 2A and 2B are provided, and two passive filters 3A and 3B are provided. In addition, a first bias supply 201 and second bias supply 202 are provided on the signal input terminal 21 side.

AS shown in FIG. 14, output terminal 3Ab of the one passive filter 3A is connected to positive supply terminal 16a of complementary-symmetry output device 16, and first bias supply 201 is connected between input terminal 2Aa of class D power amplifier 2A, which is connected to passive filter 3A, and input terminal 15a of linear voltage amplifier 15. In addition, output terminal 3Bb of the other passive filter 3B is connected to negative supply terminal 16b of complementary-symmetry output device 16, and the second bias supply 202 is connected between input terminal 15a of linear voltage amplifier 15 and input terminal 2Ba of the class D power amplifier 2B connected to the passive filter 3B. The control input terminals 2Ad and 2Bd of the two class D power amplifiers 2A and 2B are connected to the output terminal 18a of second muting circuit 18.

The linear power amplifier 6 of the high efficiency power amplifying apparatus 200 shown in FIG. 14 is identical to that shown in FIG. 1 and FIG. 3. Class D power amplifiers 2A and 2B are also qualitatively identical to the class D power amplifier 2 shown in FIG. 1 and FIG. 2. In addition, passive filters 3A and 3B are qualitatively identical to the passive filter 3 shown in FIG. 1. Compared with the high efficiency power amplifying apparatus 1 shown in FIG. 1, however, noticeably greater current flows to each of the class D power amplifiers and passive filters. The transformer 150, diode bridge circuit 151, and smoothing capacitors 152 and 153 shown in FIG. 3 for the first embodiment are therefore not needed. The circuit scale can therefore be reduced and the cost reduced.

As will be known from the preceding description, a high efficiency power amplifier with extremely low high frequency noise can be achieved without sacrificing high efficiency by inserting an equivalent active filter to the demodulating part of the class D power amplifier. In addition to audio signal amplification, a high efficiency power amplifying apparatus according to the present invention can therefore be used in a wide range of applications throughout the power control field where high efficiency is required.

Extraneous signal output can also be prevented when the power supply is turned on and off by controlling signal cut-off from the input terminal, and controlling operation of the PWM power amplifier and linear voltage amplifier, when the power switch is operated to turn the power supply on and off.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A high efficiency power amplifying apparatus for power amplifying an input signal applied to a signal input terminal, comprising:

a PWM power amplifier for power amplifying an input signal from a signal input terminal by pulse width modulation;

a passive low-pass filter for demodulating and outputting a pulse width modulated signal output from the PWM power amplifier;

a positive floating voltage supply for shifting a demodulated signal output from the passive low-pass filter a predetermined voltage +DV, and supplying a forward current;

a negative floating voltage supply for shifting a demodulated signal output from the passive low-pass filter a predetermined voltage −DV, and supplying a reverse current;

a linear voltage amplifier comprising a linear circuit for voltage amplifying an input signal from the signal input terminal, shifting the amplified signal predetermined voltages +dV and −dV, and outputting the shifted amplified signals; and an output device for current amplifying a +dV shifted voltage amplified signal by said forward current to generate a forward current amplified signal, current amplifying a −dV shifted voltage amplified signal by said reverse current to generate a reverse current amplified signal, and applying said forward current amplified signal and reverse current amplified signal in a push-pull fashion to generate a power amplified signal.

2. The high efficiency power amplifying apparatus as set forth in claim 1, wherein the output device is a push-pull circuit comprising a complementary-symmetry circuit.

3. The high efficiency power amplifying apparatus as set forth in claim 1, wherein the linear voltage amplifier and output device function as a class B power amplifier.

4. The high efficiency power amplifying apparatus as set forth in claim 1, wherein the linear voltage amplifier and output device function as a class AB power amplifier.

5. The high efficiency power amplifying apparatus as set forth in claim 1, wherein the linear voltage amplifier and output device function as a class A power amplifier.

6. The high efficiency power amplifying apparatus as set forth in claim 1, wherein the passive low-pass filter comprises a spiral shaped electrode formed on a substrate.

7. The high efficiency power amplifying apparatus as set forth in claim 6, wherein the spiral shaped electrode is a copper foil pattern forming a coil.

8. The high efficiency power amplifying apparatus as set forth in claim 1, further comprising:

an input control circuit for controlling input of the input signal from the signal input terminal to the PWM power amplifier and linear voltage amplifier;

a first operation control circuit for controlling operation of the PWM power amplifier;

a second operation control circuit for controlling operation of the linear voltage amplifier; and a control circuit for detecting start and stop of power supply from an external source, and controlling operation of the input control circuit, first operation control circuit, and second operation control circuit according to the detected result.

9. The high efficiency power amplifying apparatus as set forth in claim 8, wherein:

the control circuit, after detecting a power supply start, causes the input control circuit to interrupt supplying the input signal from the signal input terminal to the PWM power amplifier and linear voltage amplifier for a predetermined time t1, causes the first operation control circuit to interrupt signal output from the PWM power amplifier for a predetermined time t2, and causes the second operation control circuit to interrupt signal output from the linear voltage amplifier for a predetermined time t3.

10. The high efficiency power amplifying apparatus as set forth in claim 9, wherein times t1, t2, and t3 used by the control circuit are in the relationship t1>t3>t2.

11. The high efficiency power amplifying apparatus as set forth in claim 8, wherein:

the control circuit, after detecting a power supply stop, causes the input control circuit to immediately interrupt supplying the input signal from the signal input terminal to the PWM power amplifier and linear voltage amplifier, causes the first operation control circuit to interrupt signal output from the PWM power amplifier after a predetermined time t4, and causes the second operation control circuit to interrupt signal output from the linear voltage amplifier after a predetermined time t5.

12. The high efficiency power amplifying apparatus as set forth in claim 11, wherein times t4 and t5 used by the control circuit are in the relationship t4>t5.

13. A high efficiency power amplifying apparatus for power amplifying an input signal applied to a signal input terminal, comprising:

a first bias supply for applying a forward bias voltage to an input signal from the signal input terminal;

a first PWM power amplifier for power amplifying the forward biased input signal by pulse width modulation to generate a first PWM signal;

a first passive low-pass filter for demodulating the first PWM signal to generate and output a first demodulated signal;

a second bias supply for applying a reverse bias voltage to an input signal from the signal input terminal;

a second PWM power amplifier for power amplifying the reverse biased input signal by pulse width modulation to generate a second PWM signal;

a second passive low-pass filter for demodulating the second PWM signal to generate and output a second demodulated signal;

a linear voltage amplifier comprising a linear circuit for voltage amplifying an input signal from the signal input terminal, shifting the amplified signal a predetermined voltage +dV and −dV, and outputting the shifted amplified signals; and an output device for current amplifying a +dV shifted voltage amplified signal by said first demodulated signal to generate a forward current amplified signal, current amplifying a −dV shifted voltage amplified signal by said second demodulated signal to generate a reverse current amplified signal, and applying said forward current amplified signal and reverse current amplified signal in a push-pull fashion to generate a power amplified signal.

14. The high efficiency power amplifying apparatus as set forth in claim 13, wherein the output device is a push-pull circuit comprising a complementary-symmetry circuit.

15. The high efficiency power amplifying apparatus as set forth in claim 13, wherein the linear voltage amplifier and output device function as a class B power amplifier.

16. The high efficiency power amplifying apparatus as set forth in claim 13, wherein the linear voltage amplifier and output device function as a class AB power amplifier.

17. The high efficiency power amplifying apparatus as set forth in claim 13, wherein the linear voltage amplifier and output device function as a class A power amplifier.

18. The high efficiency power amplifying apparatus as set forth in claim 13, wherein the passive low-pass filter comprises a spiral shaped electrode formed on a substrate.

19. The high efficiency power amplifying apparatus as set forth in claim 18, wherein the spiral shaped electrode is a copper foil pattern forming a coil.

20. The high efficiency power amplifying apparatus as set forth in claim 13, further comprising:
   an input control circuit for controlling input of the input signal from the signal input terminal to the PWM power amplifier and linear voltage amplifier;
   a first operation control circuit for controlling operation of the PWM power amplifier;
   a second operation control circuit for controlling operation of the linear voltage amplifier; and
   a control circuit for detecting start and stop of power supply from an external source, and controlling operation of the input control circuit, first operation control circuit, and second operation control circuit according to the detected result.

21. The high efficiency power amplifying apparatus as set forth in claim 20, wherein:
   the control circuit, after detecting a power supply start, causes the input control circuit to interrupt supplying the input signal from the signal input terminal to the PWM power amplifier and linear voltage amplifier for a predetermined time t1,
   causes the first operation control circuit to interrupt signal output from the PWM power amplifier for a predetermined time t2, and
   causes the second operation control circuit to interrupt signal output from the linear voltage amplifier for a predetermined time t3.

22. The high efficiency power amplifying apparatus as set forth in claim 21, wherein times t1, t2, and t3 used by the control circuit are in the relationship t1>t3>t2.

23. The high efficiency power amplifying apparatus as set forth in claim 20, wherein:
   the control circuit, after detecting a power supply stop, causes the input control circuit to immediately interrupt supplying the input signal from the signal input terminal to the PWM power amplifier and linear voltage amplifier,
   causes the first operation control circuit to interrupt signal output from the PWM power amplifier after a predetermined time t4, and
   causes the second operation control circuit to interrupt signal output from the linear voltage amplifier after a predetermined time t5.

24. The high efficiency power amplifying apparatus as set forth in claim 23, wherein times t4 and t5 used by the control circuit are in the relationship t4>t5.

* * * * *